United States Patent [19]

Streckenbach

[11] 4,034,300
[45] July 5, 1977

[54] CIRCUIT ARRANGEMENT FOR EVALUATING RECEIVED OSCILLATIONS OF A PREDETERMINED FREQUENCY

[75] Inventor: Wulf-Christian Streckenbach, Hemmingen, Germany

[73] Assignee: Licentia Patent-Verwaltungs-G.m.b.H., Frankfurt am Main, Germany

[22] Filed: Nov. 26, 1975

[21] Appl. No.: 636,222

[30] Foreign Application Priority Data
Nov. 27, 1974 Germany .......................... 2455991

[52] U.S. Cl. ............................ 325/390; 340/168 R; 340/171 PF; 343/228
[51] Int. Cl.² ............................................ H04B 1/06
[58] Field of Search ............ 325/37, 390, 391, 392, 325/325; 178/DIG. 15; 340/147 F, 148, 167 R, 164, 168 R, 171 R, 171 PF; 343/225, 228

[56] References Cited
UNITED STATES PATENTS

| | | | |
|---|---|---|---|
| 3,651,469 | 3/1972 | Keese | 340/168 R |
| 3,798,601 | 3/1974 | Hulsbosch et al. | 340/171 PF |
| 3,855,575 | 12/1974 | Leuschner et al. | 340/171 R |
| 3,900,880 | 8/1975 | Fleischer | 343/225 |
| 3,914,698 | 10/1975 | Leuschner | 325/390 |
| 3,953,832 | 4/1976 | Streckenbach | 340/171 R |

Primary Examiner—Robert L. Griffin
Assistant Examiner—Jin F. Ng
Attorney, Agent, or Firm—Spencer & Kaye

[57] ABSTRACT

A circuit arrangement for evaluating a received control signal of the type including a first signal of a first predetermined frequency and of a time duration which represents information, and a second signal which immediately follows the first signal in time and has a second predetermined frequency different than the first frequency. In the circuit arrangement the time duration of the first signal is determined by feeding the oscillations of the first signal to a memory which stores a count representative of the number of received oscillations of the first signal, and serially discharging the contents of the memory upon receipt of the second signal and supplying the contents in series to an output terminal which is connected to the control circuit for evaluating and responding to the information.

10 Claims, 3 Drawing Figures

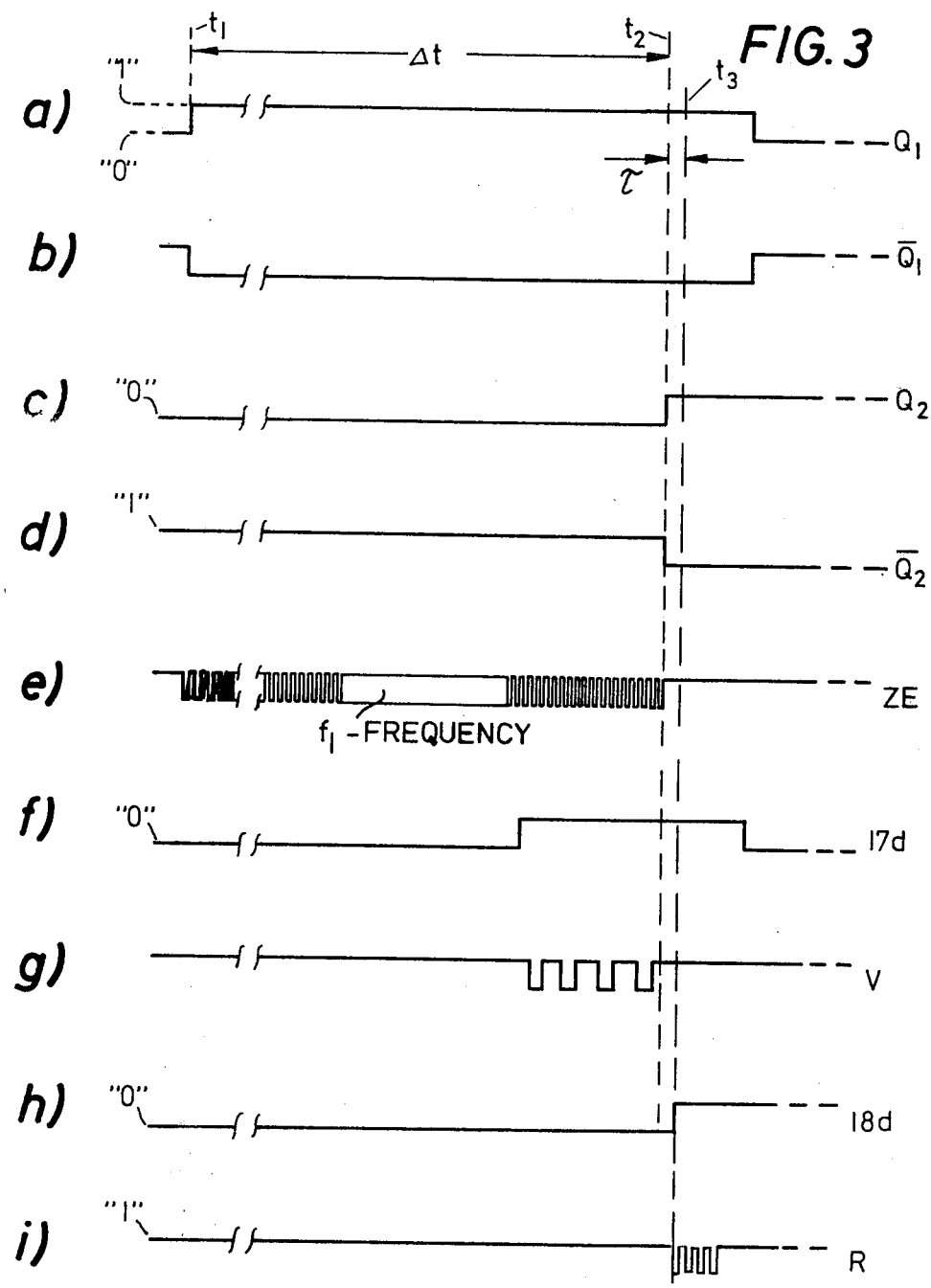

CIRCUIT ARRANGEMENT FOR EVALUATING RECEIVED OSCILLATIONS OF A PREDETERMINED FREQUENCY

CROSS REFERENCE TO RELATED APPLICATION

This application is related to applicant's copending U.S. Pat. application Ser. No. 636,225 filed Nov. 26th, 1975.

BACKGROUND OF THE INVENTION

The present invention relates to a circuit arrangement for evaluating received oscillations of a first predetermined frequency by determining the time duration of the oscillations, which duration constitutes information, with the information itself being evaluated in a subsequent control circuit oscillations of a different frequency which are received subsequent to the oscillations of the first predetermined frequency. More particularly the present invention relates to such a system wherein the received oscillations are ultrasonic oscillations used for the remote control of a television receiver.

It is known that information, e.g. information for the operation of an instrument, can be transmitted over wires or without wires. It is possible, for example, to operate a television receiver by means of a wireless ultrasonic remote control system. Special measures are then required to prevent the receiver from responding to inadvertent erroneous instructions which could be produced by interfering frequencies not emitted by the ultrasonic generator of the control system.

For this reason the ultrasonic remote control device disclosed in the periodical "Funkschau" 1973, Issue No. 18, pages 675–677, utilizes an ultrasonic signal which contains the desired operating function and which consists of two immediately successive frequencies. The first frequency $F_1$ or $F_2$ of the ultrasonic signal determines whether a channel is being selected or a level is being changed, while the time duration of the ultrasonic signal at the first frequency determines the number of the channel being selected or the type and direction of the change in level, respectively. The performance of the previously recognized and stored instruction is not actuated, however until the second immediately following ultrasonic signal at frequency $F_3$ is received. If in the known ultrasonic remote control system an interference signal occurs at frequency $F_1$ or $F_2$, this signal can be received by the ultrasonic receiver but the instruction is not performed unless frequency $F_3$ appears immediately thereafter. In this way the production of erroneous functions in the television receiver caused by interfering frequencies is avoided.

In this known ultrasonic remote control system a multivibrator is operated during the presence of frequency $F_1$ and two decimal counters count the pulses from this multivibrator. If the first received frequency had the value $F_1$ then the number of counted pulses constitutes the channel number. If, however, the received frequency had the other value $F_2$, the number of the counted pulses determines the direction and type of change of level. The outputs of the two decimal counters are connected to a control circuit to effect the change in level or channel selection, respectively. When subsequent to the first frequency $F_1$ or $F_2$ the other frequency $F_3$ is received, the counters are unlocked. The stored counter contents now switches one of its outputs so that the control circuit can perform the instruction associated with that particular output.

SUMMARY OF THE INVENTION

It is the object of the present invention to simplify this known arrangement.

This is accomplished according to the present invention in that in a circuit for evaluating a received control signal of the type including a first signal of a first predetermined frequency and of a time duration which represents the information and a second signal which immediately follows the first signal in time and has a second predetermined frequency different than the first frequency, the time duration of the first signal is determined by feeding the first signal to a means for counting the oscillations of same which means includes: a memory for storing a count representative of the number of received oscillations of the first signal and further means responsive to the receipt of the second signal for serially discharging the memory and for serially supplying the contents of the memory to an output terminal which is connected to a control circuit which evaluates and responds to the information represented by the time duration of the first signal.

According to the preferred embodiment of the invention, the memory is a forward-backward counter, operating in binary code, whose forward counting input receives a number of pulses representing the information, which pulses constitute a defined period duration at the predetermined frequency, and whose backward counting input receives a sufficient number of pulses of any selectable frequency after receipt of the second signal to cause the counter to be discharged, i.e., counted back to zero, the backward counting input being connected with the terminal connected to the control circuit. According to an advantageous feature of the invention the frequency of the pulses fed to the backward counting input is selected to be substantially higher than the frequency of the pulses fed to the forward counting input so that the memory is serially emptied faster than it is filled.

Thus in the present invention the oscillations of the first predetermined frequency themselves are fed into the memory, and upon the occurrence of the second frequency the pulses stored in the memory are fed in succession to the control circuit. Thus the multivibrator required in the prior art ultrasonic remote control device can be eliminated. A further advantage is that the memory can be realized in a substantially simpler manner and no parallel discharge but serial discharge is provided for the memory.

BRIEF DESCRIPTION OF THE DRAWINGS

FIG. 3 shows the voltage level curves for some points in the circuit of FIG. 2.

DETAILED DESCRIPTION OF THE PREFERRED EMBODIMENTS

Figure 1:
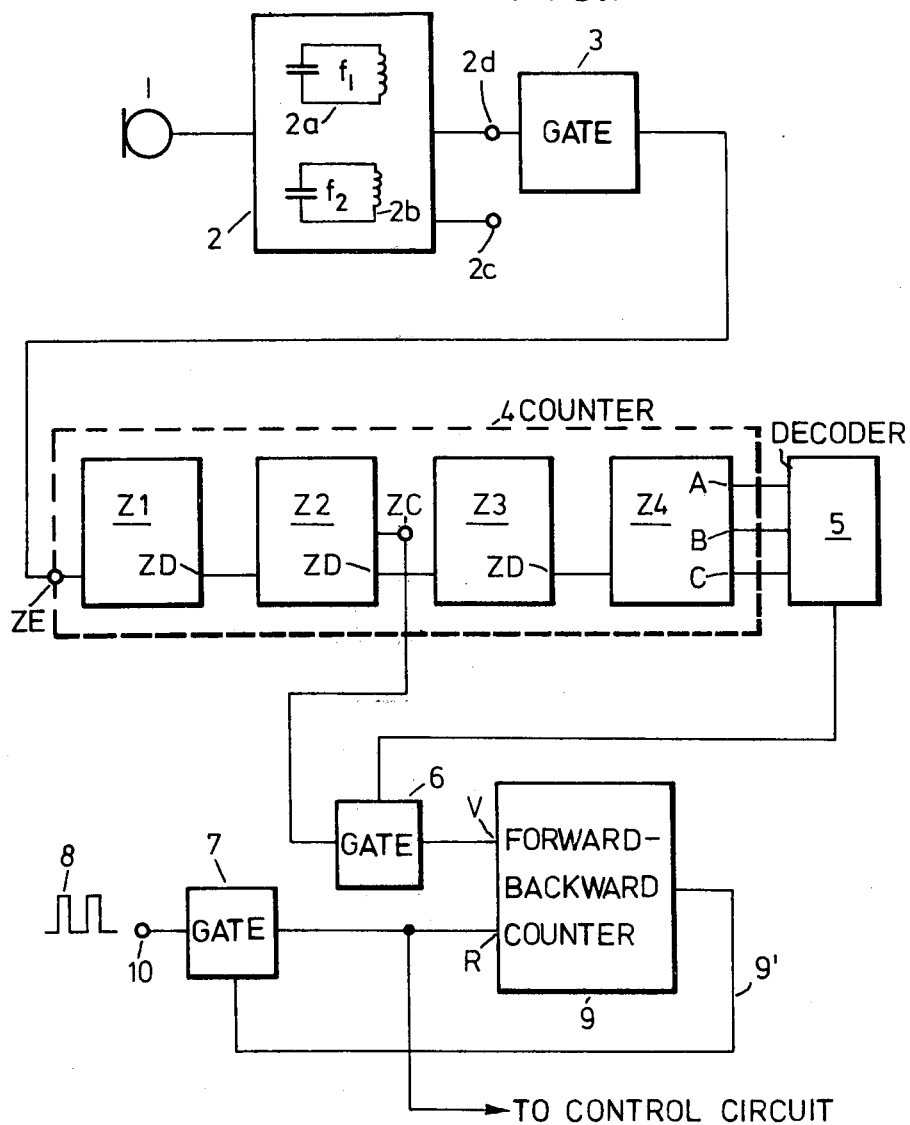
FIG. 1 is a basic block diagram for a circuit according to the invention.

In FIG. 1 ultrasonic oscillations are received by an ultrasonic converter 1 and fed to a circuit component 2. Circuit component 2 includes, inter alia, two resonant circuits 2a and 2b, which are tuned to frequencies $f_1$ and $f_2$ respectively. The ultrasonic frequencies are, for example, $f_1 = 35$ kHz, and $f_2 = 37$ kHz. The component 2 tends to separate the two frequencies so that squarewave oscillations of the predetermined frequency $f_1$ appear at output terminal 2d while squarewave oscillations of frequency $f_2$ appear at output terminal 2c. The squarewave oscillations at frequency $f_1$ are fed via a gate 3 to the counter input ZE of a counter 4. The gate 3 which will be explained in detail below permits oscillations at frequency $f_1$ to pass only as long as no oscillations at the other frequency $f_2$ are received.

The counter 4 includes a counter chain including counting stages Z1, Z2, Z3 and Z4 with the outputs of the last counting stage Z4 being connected with a decoder 5, and with one of the lower value outputs ZC of the second counter stage Z2 being connected via a gate 6 to a memory which is here formed by a forward-backward counter 9. Gate 6 permits the squarewave oscillations to reach the forward counter input V of the forward-backward counter 9 only when decoder 5 has recognized a certain counting state at the outputs of counter stage Z4. In the illustrated embodiment counter stage Z1, is a 4-bit binary counter whose counting capability is sixteen, counters Z2 and Z3 are each 4-bit counters with a counting capability of ten, while counter Z4 is a 3-bit binary counter which is capable of counting up to eight. The respective outputs ZD of counting stages Z1, Z2 and Z3 associated with the highest value are connected with the counting inputs of the respectively subsequent counter stages. The counting input of counter stage Z2 thus receives a counting pulse after every 16 pulses at input ZE of counter 4 which is connected to the input of counter stage Z1, while a counting pulse reaches counter stage Z3 after every 160 (16 · 10) pulses at the counting input of counter stage Z1.

The above-mentioned decoder 5 controls gate 6, for example, to be conductive whenever a logic 1 is present at both output A and output B. In this case the counter state of counter stage Z4 is three, i.e., 4800 oscillations at frequency $f_1$ have been counted at this time by counter 4. The pulses present at counter output ZC of counter stage Z2 thereafter travel through gate 6 to the forward-backward counter 9. At the above-mentioned counter output ZC, representing the $2^2$ bit position, of 4-bit counter Z2, as a result of the use of the known binary code, a logic 1 is present whenever its counter state is four, five, six or seven and a logic 0 is present at the other possible counter states, so that the counter output ZC emits a pulse after every 160 oscillations at input ZE. The number of pulses counted by forward-backward counter 9 determines, for example, which channel is to be selected, i.e., contains the instruction for change of station.

With the beginning of frequency $f_2$ gate 3 is blocked so that no further pulses can reach forward-backward counter 9. At the same time, the occurrence of the other frequency $f_2$ enables gate 7 (via a connection not shown in FIG. 1) so that pulses 8 fed to input terminal 10 reach the backward counting input R of forward-backward counter 9. The backward counting input R is also connected to the control circuit which, for reasons of clarity, is also not shown in FIG. 1. The control circuit which is known per se, for example the ultrasonic remote control device "Supersonic 200" made by AEG-Telefunken, Germany, effects switching to the desired channel in dependence on the pulses it receives. Such control device is described in "Funkschau" 1973, page 920 FIG. 4 and page 922, left column. IC's shown in FIG. 4 on page 920 are described in "Funkschau" 1972 page 262.

It is known that every pulse at the backward counting input R of forward-backward counter 9 reduces the counter contents by one. Via a connection 9', gate 7 is also controlled in dependence on the counter state of forward-backward counter 9 so that it passes the pulses 8 only as long as the counter state of forward-backward counter 9 is other than zero. If, for example, three pulses were passed through the gate 6 and stored in forward-backward counter 9, only three pulses 8 can reach the backward counting input R. The subsequently connected control circuit thus receives in timely succession the same number of pulses as were stored in the forward-backward counter 9. The frequency of pulses 8 is advantageously selected to be higher than the frequency of the pulses fed to forward counting input V of counter 9 so that discharging or reading of the forward-backward counter 9 takes place faster than the writing or storage of pulses therein.

As already mentioned, counter stage Z4 in conjunction with decoder 5 permits the oscillations to reach forward-backward counter 9 only after 4800 oscillations at frequency $f_1$ have been received. The logic states at the counting outputs A, B, C of 3-bit counter stage Z4 thus effect a division into time regions which are defined by a respective number of oscillations. After 1600 (16 · 10 · 10) oscillations at frequency $f_1$ have been counted, the last counter stage Z4 receives a counting pulse and takes on the counter state "one." At the outputs A, B, C, according to the binary code, there then appears the logic state 1, 0, 0, which identifies a time period I. After a further 1600 oscillations, i.e., after a total of 3200 oscillations, a further pulse is delivered to counter stage Z4. At the outputs A, B, C of stage Z4 there then appears the logic state 0, 1, 0, which identifies time region II which now begins. Due to the described division into time regions which can also be called groups it will no longer be necessary to use two different frequencies for the first part of the ultrasonic signal, in that each time region has associated to it a certain type of information. For example, the time region III which is of interest here, and which begins after 4800 oscillations have been counted (the logic states at counter outputs A, B, C of counter stage Z4 are then 1, 1, 0), is associated to the channel selection function. The circuit arrangement thus recognizes the oscillations which are fed to forward-backward counter 9 after the 4800 oscillations indicating the beginning of time region III have appeared as belonging to the category "channel selection function." The oscillations in time region II, which begins after 3200 oscillations and is associated, for example, to special functions, are fed, once decoder 5 has recognized the beginning of time region II, by counting output ZC of counter stage Z2 to another control circuit (not shown) to evaluate special functions. Once a time region and thus the type of information to be transmitted has been determined by the outputs A, B, C of counter stage Z4, the time duration of the transmitted signal at frequency $f_1$, i.e., the special information within the time region itself, is determined by the pulses obtained from counting output ZC of counter stage Z2. This special information depends on at which point, i.e., after how many oscillations within a time region, the time duration of the signal at frequency $f_1$ ends. A more detailed description of the time regions and a transmitter for generating same is disclosed in copending application Ser.

No. 588,177 filed June 18th, 1975 now U.S. Pat. No. 3,973,241, issued Aug. 3rd, 1976, the subject matter of which is incorporated herein by reference.

Figure 2:
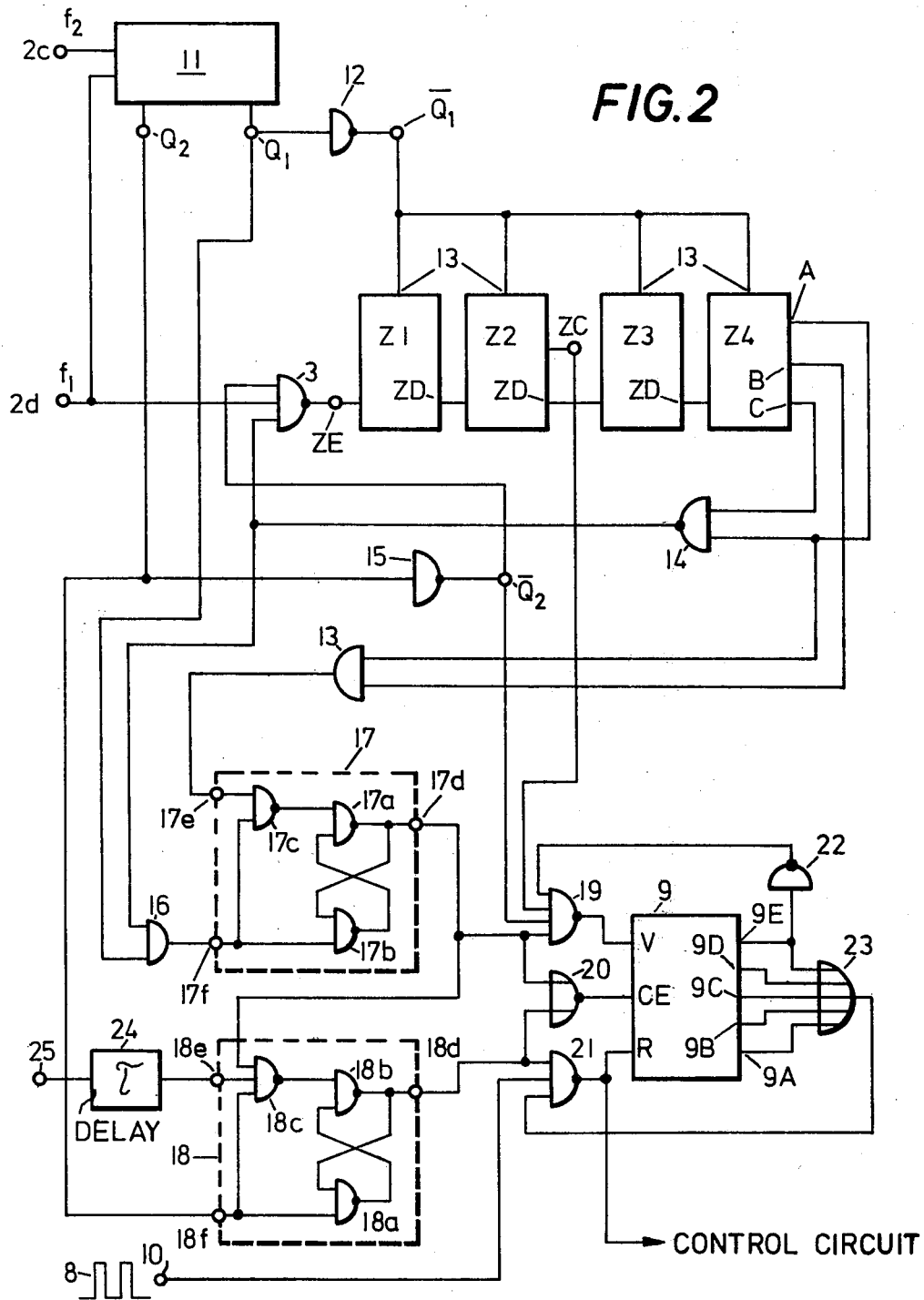
FIG. 2 is a logic circuit diagram of a preferred embodiment for the basic block circuit diagram of FIG. 1.

FIG. 2 shows the circuitry for one embodiment of the invention which is based on the basic circuit diagram of FIG. 1. Corresponding parts bear the same reference numerals in FIGS. 1 and 2. The oscillations at frequencies $f_2$ or $f_1$ are present at terminals 2c and 2d, respectively, which terminals are connected to an auxiliary circuit 11 which has two output terminals $Q_1$ and $Q_2$. The auxiliary circuit 11 produces, at the presence of oscillations of frequency $f_1$, logic states $Q_1 = 1$ and $Q_2 = 0$ at output terminals $Q_1$ and $Q_2$. If frequency $f_2$ appears, a logic 1 will appear at once at terminal $Q_2$, while the potential at $Q_1$ changes only later from 1 to 0. The potential curve is shown in FIGS. 3a and 3c. The inverted logic states appear at terminals $\overline{Q}_1$ and $\overline{Q}_2$ which are connected with terminals $\overline{Q}_1$ and $\overline{Q}_2$ via inverters 12 and 15, i.e., the logic states at terminals $Q_1$ and $Q_2$ are 1, for example, if $Q_1 = Q_2 = 0$. The occurrence of oscillations at frequency $f_1$ sets counter stages Z1, Z2, Z3, Z4 to counter state "zero" so that they are ready to count due to the logic 0 at terminal $\overline{Q}_1$ which is connected to the reset input 13 of each of the counter stages.

Two flip-flops 17, 18, each having an enabling input 17f and 18f, a setting input 17e and 18e and an output 17d and 18d, respectively, are formed by two crosswise coupled NAND gates 17a, 17b and 18a, 18b, which are each controlled by a NAND gate 17c, 18c, respectively. The forward-backward counter 9 is, for example, a 5-bit binary counter whose five outputs 9A, 9B, 9C, 9D and 9E are connected with an OR gate 23. Connected to the forward counting input V of the forward-backward counter 9 is the output of a NAND gate 19, which essentially corresponds to the gate 6 of FIG. 1. A first input of NAND gate 19 is connected with the output 17d of flip-flop 17 and with the one input of a NOR gate 20 whose output is connected to the so-called clear-input CE of the forward-backward counter 9. A second input of NAND gate 19 is connected to terminal $\overline{Q}_2$ and to the one input of gate 3 which is here also formed by a NAND gate. A third input of NAND gate 19 is connected with the output ZC of counter stage Z2. As already described in connection with FIG. 1, this output ZC is passed once after every 160 oscillations at counting input ZE of counter stage Z1. Finally, a fourth input of NAND gate 19 is connected, via an inverter 22, with the output 9E of forward-backward counter 9. The output 9E is associated with the highest-value position of forward-backward counter 9 which counts in the binary code. Output 18d of flip-flop 18 is connected to the other input of NOR gate 20 and to a first input of a NAND gate 21 (which essentially corresponds to gate 7 of FIG. 1) whose output is connected to the backward counting input R of counter 9 and to the control circuit (not shown). A second input of NAND gate 21 receives the pulses 8 via the terminal 10 while the third input of NAND gate 21 is connected with the output of the above-mentioned OR gate 23.

Outputs A and C of counter stage Z4 are connected to a NAND gate 14 whose output is connected to one input of NAND gate 3, and with one input of an AND gate 16 whose other input leads to terminal $Q_1$. The output of AND gate 16 is connected to the enabling input 17f of flip-flop 17. The outputs B and A of counter stage Z4 are connected with the setting input 17e of flip-flop 17 via and AND gate 13. The setting input 18e of flip-flop 18 leads, via a delay circuit 24, to a terminal 25, while the enabling input 18f of flip-flop 18 is connected with terminal $Q_2$.

The operation of the above-described circuit will now be described, reference being made, where necessary, to the diagrams of FIG. 3 in which the logic states at the points or terminals involved are shown. As already mentioned, FIGS. 3a and 3c show that with the beginning of the occurrence of oscillations at frequency $f_1$ at terminal 2d at time $t_1$, $Q_1 = 1$ and $Q_2 = 0$.

In FIGS. 3b and 3d the inverse states at terminals $\overline{Q}_1$ and $\overline{Q}_2$ are shown. From time $t_1$ on, oscillations at frequency $f_1$ reach the counting input ZE of counter stage Z1 via NAND gate 3, as shown in FIG. 3e. After 4800 oscillations have been counted by counter stages Z1, Z2, Z3 and Z4, (the logic states at outputs A, B, and C of counter stage Z4 are then A = 1, B = 1 and C = 0) flip-flop 17 is set by a logic 1 at its setting input 17e. Flip-flop 17 can be set because a logic 1 is present at its enabling input 17f via AND gate 16. Actually flip-flop 17 is enabled via AND gate 16 at the beginning of the ultrasonic signal, i.e., at time $t_1$, by $Q_1 = 1$. NAND gate 17a now changes from 0 to 1. Due to the logic 1 at output 17d of flip-flop 17, the forward-backward counter 9 is released via NOR gate 20 (see FIG. 3f). Forward-backward counter 9 is ready to count only if a logic 0 is present at its clear input CE. Counting pulses can now travel through NAND gate 19 from the output ZC of counter stage Z2 into forward-backward counter 9. In the present case a maximum of 16 pulses can be counted and stored since with the sixteenth pulse a logic 1 appears at output 9E so that NAND gate 19 will be blocked via inverter 22. The counting capability of forward-backward counter 9 can be expanded, however, for example to 32 or 34 or to any desired number of memory positions.

At time $t_2$, when the received oscillations of the other frequency $f_2$ appear at terminal 2c, NAND gate 3 is blocked due to $\overline{Q}_2 = 0$ so that oscillations at frequency $f_1$ can no longer reach counting input ZE. Thus not further pulse can be counted into forward-backward counter 9 (see FIGS. 3c-e and 3g). Flip-flop 18 is now enabled for setting by $Q_2 = 1$ at its enabling input 18f. However, it is set only after a certain delay $\tau$. For this purpose the setting input 18e is connected to the output of a delay circuit 24 whose input is connected to a terminal 25 which is provided with a logic 1 for example at time $t_2$, so that the delay circuit 24 will transfer this logic 1 to the setting input 18e only after a delay time $\tau$. The delay circuit 24 may be realized, for example, by a monostable multivibrator which is triggered at time $t_2$ by $Q_2 = 1$. The resulting potential curve at the output 18d of flip-flop 18 as a consequence of the delayed setting is shown in FIG. 3h.

After the above-mentioned delay time $\tau$, i.e., at time $t_3$, all three inputs of NAND gate 18c carry a 1 potential because output 17d of flip-flop 17 is still at logic 1 due to $Q_1 = 1$. Flip-flop 18 is thus set at time $t_3$ and takes over the holding functions of flip-flop 17 at NOR gate 20. Furthermore, output 18d releases NAND gate 21. Pulses 8 fed to terminal 10, which may originate, for example, from a quartz oscillator, now reach the backward counting input R of forward-backward counter 9 which now counts back to "zero." The counting back can take place of course only to "zero" because at this counter state NAND gate 21 is blocked via the output signal from OR gate 23 which responds to the counter state. That is, a logic 1 will be present at the output of OR gate 23 as long as counting pulses are stored in the forward-backward counter 9. Thus only so many pulses 8 can reach the backward counting input R as have previously been received from counting output ZC of counter stage Z2. These pulses 8 passed through gate 21 to input R (see FIG. 3i) are fed in timely succession to the control circuit (not shown) where they are evaluated in a known manner and perform the desired channel selection. In the illustrated embodiment frequency $f_1$, for example, is selected so that forward counting at the forward counting input V is effected with approximately 4.4 ms per pulse. The frequency of pulses 8 is advantageously selected so that backward counting occurs faster, e.g. at approximately 0.9 ms per pulse. The pulses are thus shifted out of the forward-backward counter 9 approximately five times as fast as they were counted into it. This produces rapid performance of the transmitted remote control instruction so that the operator will not notice any significant delay during the remote control operation.

It will be understood that the above description of the present invention is susceptible to various modifications, changes and adaptations, and the same are intended to be comprehended within the meaning and range of equivalents of the appended claims.

What is claimed is:

1. In a circuit arrangement for evaluating a received control signal of the type including a first signal of a first predetermined frequency and of a time duration which represents information, and a second signal which immediately follows the first signal in time and has a second predetermined frequency different than said first frequency, said circuit arrangement including first means for receiving the control signal and second means, connected to said first means, for determining the time duration of said first signal by counting the oscillations of the first signal and for supplying an output signal representative of the number of oscillations, and hence of said information, to a control circuit which responds to said information, the improvement wherein said second means includes a memory to which the oscillations of said first signal are fed and which stores a count representative of a number of received oscillations of said first signal, and further means responsive to the receipt of said second signal for serially discharging the contents of said memory and for supplying said contents in series, as said output signal, to an output terminal connected to the control circuit.

2. A circuit arrangement as defined in claim 1 wherein said control signal is an ultrasonic signal, said circuit arrangement is for a television receiver and said information is a channel selection instruction for the television receiver.

3. A circuit arrangement as defined in claim 1 wherein: said memory is a forward-backward binary counter having a plurality of bit positions, a forward counting input and a backward counting input; said second means includes means for feeding a number of oscillations of said first frequency, which number constitutes the information, to said forward counting input; and said further means includes means for supplying pulses of a selectable frequency to said backward counting input, said backward counting input being connected to said output terminal connected to the control circuit.

4. A circuit arrangement as defined in claim 3 wherein the frequency of said pulses fed to said backward counting input of said counter is greater than the frequency of the counting pulses fed to said forward counting input.

5. A circuit arrangement as defined in claim 3 wherein said second means further includes gate means for permitting the oscillations of said first frequency to be fed to said forward counting input only as long as said second frequency is not received.

6. A circuit arrangement as defined in claim 5 wherein said gate means comprises a NAND gate whose output is connected to said forward counting input of said forward-backward counter, said NAND gate having first, second, third and fourth inputs, said first input being connected to receive the oscillations at said first predetermined frequency; means connected to said second input of said NAND gate for supplying a logic 0 to said second input upon receipt of said second frequency; means connected to said third input of said NAND gate for supplying a logic 1 to said third input after a certain number of oscillations at said first predetermined frequency have been received; and an inverter connecting the output terminal of said forward-backward counter which is associated to the highest value bit position in said forward-backward counter with said fourth input of said NAND gate.

7. A circuit arrangement as defined in claim 6 wherein said means connected to said third input of said NAND gate includes a flip-flop whose output is connected to said third input of said NAND gate; and means connected to the setting input of said flip-flop for setting same to cause a logic 1 to appear at the output after a predetermined number of oscillations at said first predetermined frequency have been received.

8. A circuit arrangement as defined in claim 3 wherein said further means includes: a source of pulses of said selectable frequency; a gate having its output connected to said backward counting input of said forward-backward counter and one input connected to the output of said source of pulses; and means for controlling said gate to open same and pass the output pulses from said source of pulses when said second signal of said second predetermined frequency has been received and if the counter state of said forward-backward counter is other than "zero."

9. A circuit arrangement as defined in claim 8 wherein said gate is a NAND gate; and wherein said means for controlling said gate includes: means for feeding a logic 1 signal to a second input of said NAND gate upon receipt of said second signal of said second predetermined frequency and after a suitable delay period; and an OR gate whose output is connected to a third input of said NAND gate and whose inputs are connected with the output terminals of the bit positions of said forward-backward counter.

10. A circuit arrangement as defined in claim 9 wherein said means for feeding a logic 1 to a second input of said NAND gate includes: a flip-flop whose output is connected to said second input; and a delay member whose output is connected to the setting input of said flip-flop and to whose input is supplied a signal indicating receipt of said second signal.

* * * * *